(12) United States Patent
Zhang et al.

(10) Patent No.: US 8,004,290 B1
(45) Date of Patent: Aug. 23, 2011

(54) METHOD AND APPARATUS FOR DETERMINING DIELECTRIC LAYER PROPERTIES

(75) Inventors: Xiafang Zhang, San Jose, CA (US); Nanchang Zhu, Shanghai (CN); Yiping Feng, Cupertino, CA (US); Min Xiang, Shanghai (CN); Jianou Shi, Milpitas, CA (US)

(73) Assignee: KLA-Tencor Corporation, San Jose, CA (US)

( * ) Notice: Subject to any disclaimer, the term of this patent is extended or adjusted under 35 U.S.C. 154(b) by 655 days.

(21) Appl. No.: 12/061,447

(22) Filed: Apr. 2, 2008

Related U.S. Application Data

(60) Provisional application No. 60/910,157, filed on Apr. 4, 2007.

(51) Int. Cl.
*G01R 27/26* (2006.01)
*G01R 31/26* (2006.01)

(52) U.S. Cl. .................. 324/671; 324/762.02
(58) Field of Classification Search ............ 324/671
See application file for complete search history.

(56) References Cited

U.S. PATENT DOCUMENTS

| | | | |
|---|---|---|---|
| 4,599,558 A | 7/1986 | Castellano et al. | 324/752 |
| 4,812,756 A | 3/1989 | Curtis et al. | 324/750 |
| 5,594,247 A | 1/1997 | Verkuil et al. | 250/326 |
| 5,644,223 A | 7/1997 | Verkuil | 324/158.1 |
| 5,650,731 A | 7/1997 | Fung et al. | 324/752 |
| 5,767,693 A | 6/1998 | Verkuil | 324/767 |
| 6,249,117 B1 * | 6/2001 | Koelsch et al. | 324/158.1 |
| 6,855,569 B1 * | 2/2005 | Sarfaty | 438/17 |
| 6,914,443 B2 * | 7/2005 | Litman et al. | 324/751 |
| 7,012,438 B1 * | 3/2006 | Miller et al. | 324/716 |
| 7,012,439 B2 * | 3/2006 | Pinto et al. | 324/751 |
| 2007/0109003 A1 * | 5/2007 | Shi et al. | 324/755 |

OTHER PUBLICATIONS

U.S. Appl. No. 60/910,157, filed Apr. 4, 2007.
U.S. Appl. No. 60/423,225, filed Nov. 1, 2002.

* cited by examiner

*Primary Examiner* — Jeff Natalini
(74) *Attorney, Agent, or Firm* — Joshua D. Isenberg; JDI Patent

(57) ABSTRACT

A method and apparatus for determining dielectric layer properties are disclosed. Dielectric layer properties such as dielectric thickness, dielectric leakage or other electrical information may be determined for a multilayer film stack on a semiconducting or conducting substrate. The film stack may comprise a first dielectric layer between the substrate and an intermediate layer of semiconducting or conducting material, and a second dielectric layer disposed such that the intermediate layer is between the first and second dielectric layers. The dielectric layer properties may be determined by a) depositing electrical charge at one or more localized regions on an exposed surface of the second dielectric layer; b) performing a measurement of an electrical quantity at the one or more localized regions; and c) determining a property of the second dielectric layer from the one or more measurements.

35 Claims, 6 Drawing Sheets

METHOD AND APPARATUS FOR DETERMINING DIELECTRIC LAYER PROPERTIES

CLAIM OF PRIORITY

This application claims the benefit of priority of commonly-assigned co-pending U.S. Provisional Patent Application No. 60/910,157 filed February Apr. 4, 2007, the entire contents of which are incorporated herein by reference.

FIELD OF THE INVENTION

This invention generally relates to semiconductor processing and more particularly to determining dielectric thickness, dielectric leakage or other electrical information in a multi-layer film stack on a semiconducting or conducting substrate.

BACKGROUND OF THE INVENTION

Dielectric film thickness and film integrity on SOI (Semiconductor Oxide Insulator) or under poly/metal layer is a critical parameter that must be carefully measured and controlled for integrated circuit (IC) processing. The electrical thickness and film integrity of dielectric films is normally tested after completion of device processing in an end of line final electrical parameter test. However, it can take 45 to 60 days or more to obtain the results of the electrical parameter test. If issues with dielectric electrical thickness uniformity and electrical performance are detected, the wafers with semiconductor device built in have to be scrapped. In addition, all the wafers undergoing the same or similar processing within the same time period may be at risk of being scrapped.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the embodiments of the invention described below are set forth without any loss of generality to, and without imposing limitations upon, the claimed invention.

In embodiments of the present invention, dielectric layer properties such as dielectric thickness, dielectric leakage or other electrical information may be determined for a multi-layer film stack on a semiconducting or conducting substrate. The film stack may comprise a first dielectric layer between the substrate and an intermediate layer of semiconducting or conducting material, and a second dielectric layer disposed such that the intermediate layer is between the first and second dielectric layers. The dielectric layer properties may be determined by a) depositing electrical charge at one or more localized regions on an exposed surface of the second dielectric layer; b) performing a measurement of an electrical quantity at the one or more localized regions; and c) determining a property of the second dielectric layer from the one or more measurements.

Figure 1:
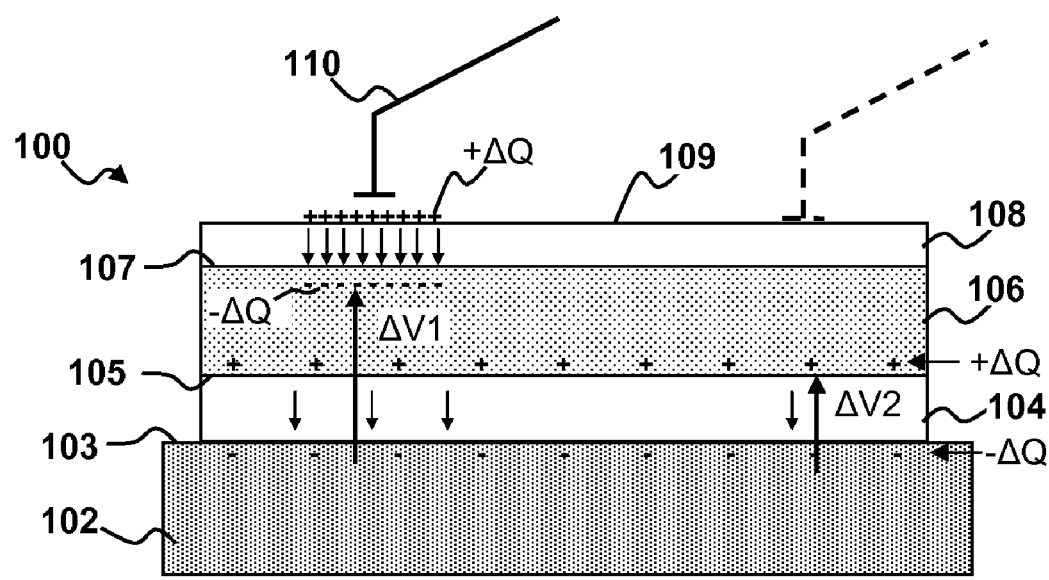
FIG. 1 is a schematic diagram of a thin film dielectric stack illustrating measurement of properties of different dielectric layers in the stack according to an embodiment of the present invention.

According to an embodiment of the present invention, dielectric thickness, dielectric leakage or other electrical information may be determined in a multilayer film stack. As shown in FIG. 1, a multilayer film stack 100 may be formed on a semiconducting or conducting substrate 102. The substrate 102 may be made of a conducting or semiconducting material such as silicon, GaAs, Ge or mixture of Si/Ge. The silicon may be doped with N-type or P-type dopants. The stack 100 may comprise a first dielectric layer 104 an intermediate layer 106 and a second dielectric layer 108. The stack 100 may be a silicon on insulator (SOI) stack or any (semi)conductor/dielectric/(semi)conductor sandwich stack. The first dielectric layer may be made of an oxide, e.g., the first dielectric layer 104 is disposed between the substrate 102 and the intermediate layer 106. By way of example, and without limitation, the dielectric layers 104, 108 may comprise silicon oxide ($SiO_2$), silicon oxynitride (SiON), silicon nitride (SiN), silicon carbide (SiC), a metal oxide and metal oxynitride (high k) film. Alternatively, the dielectric layers 104, 108 may be made of a low dielectric constant (low k) film, such as carbon doped oxide, porous ultra low k film and spin-on polymer low k film, SiLk, Nanoglass and MSQ low k film. The intermediate layer 106 may be made of a semiconducting or conducting material, such as metal, metal silicide (TiSi, NiSi, TaSi, etc.), polysilicon. The polysilicon may be doped with N-type or P-type dopants.

By way of example and without loss of generality, the dielectric film stack 100 may be part of a test pad of, e.g., about 100 μm by about 50 μm, in size. Such a test pad may be formed, e.g., in a scribe line between two or more adjacent integrated circuit device die on the substrate 102. The first dielectric layer 104 may be about 40 angstroms thick, the intermediate layer 106 may be about 1000 angstroms thick, and the second dielectric layer 108 may be about 20 angstroms thick. Although planar structures are illustrated in FIG. 1 for the sake of example, embodiments of the invention may be implemented on non-planar dielectric film structures. For example, the intermediate layer 106 and dielectric layer 104 may be configured as three-dimensional structures, such as trenches. In addition, the size, thickness and shape of dielectric layers 104, 108 and intermediate layer 106 is not limited to those mentioned in the above example or other examples described herein.

Structures such as those described above may have similar dimensions and may be of the same layers as gate stack structures in MOSFET transistors fabricated elsewhere on the substrate 102. In some processes the second dielectric layer 108 (e.g., a gate oxide) may be formed on the intermediate layer 106 (e.g., polysilicon) in a single fabrication step. In such situations, it is desirable to measure the thickness or other properties of the second dielectric layer in situ before performing further fabrication steps. Such properties may be measured in a contact or non-contact manner through the use of localized charge deposition on the second dielectric layer 108.

As shown in FIG. 1, electrical charge ΔQ may be deposed in a localized region on an exposed surface 109 of the second dielectric layer 108. The deposited charge ΔQ may be either positive or negative. By way of example, a positive charge +ΔQ is deposited on the exposed surface 109, as shown in FIG. 1. Although the charge +ΔQ is shown as being deposited in one location in FIG. 1, it is also possible to deposit charge on the surface 109 at multiple locations on the surface 109. The electrical charge ΔQ may be deposited using a corona discharge, electron beam, ion beam, defined area source or wire source. Charge is not deposited on other regions of the exposed surface 109. Due to the nature of dielectric materials, the charge +ΔQ tends to remain localized to the region onto which it was deposited. Charge is redistributed in the intermediate layer 106 so that a charge −ΔQ is concentrated at a surface 107 of the intermediate layer 106 proximate the second dielectric layer 108 in a mirror image of the deposited charge +ΔQ. In addition charge +ΔQ is distributed over a surface 105 of the intermediate layer 106 proximate the first dielectric layer 104 and charge −ΔQ is distributed over a portion of a surface 103 of the substrate 102 proximate the first dielectric layer 104.

A first measurement of an electrical quantity may be at the region where the charge ΔQ (either positive or negative) was deposited. A second measurement of the electrical quantity may be performed at a second location on the surface 109 where charge was not deposited. By way of example the first and second measurements may be measurements of voltage, total charge, surface photo-induced voltage (SPV), charge versus time, leakage current, interface trapped density ($D_{it}$), flat band voltage ($V_{fb}$)), and the like. A property of the second dielectric layer 108 may be determined from the first and second measurements. It is noted that the property of the second dielectric layer 108 may be the measured electrical quantity or some other property derived from the measured electrical quantity. Examples of properties that may be derived include dielectric layer thickness, equivalent oxide thickness (EOT), leakage currents, interface trapped density saturated Vs measurements by corona technique, Tunnel voltage (soft breakdown) measurements and the like.

Figure 2:
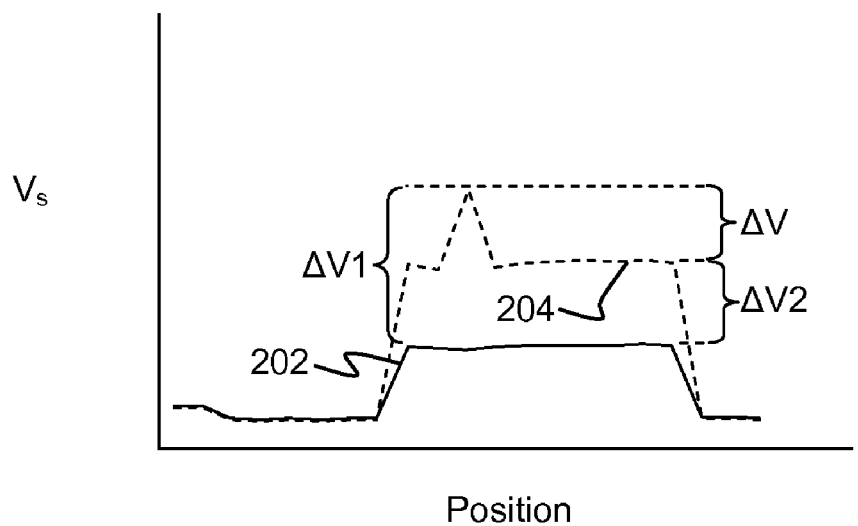
FIG. 2 is a graph of surface voltage Vs as a function of position on a test pad illustrating determination of electrical properties in the film stack of FIG. 1.

By way of example and without loss of generality, a probe 110 may measure a surface voltage $V_s$. The probe 110 may make a first measurement ΔV1 may be made at the location where the charge ΔQ was deposited and a second measurement ΔV2 at a different location where charge was not deposited. The thickness of the second dielectric layer 108 may be determined by taking the difference in the two voltage readings ΔV=ΔV1−ΔV2. By way of example, the readings may be obtained by scanning the probe 110 across the thin film stack 100 and plotting voltage as a function of position, e.g., as shown in FIG. 2. An initial scan 202 may be performed to determine a baseline voltage. After the charge ΔQ has been deposited, a subsequent scan 204 may be performed to obtain ΔV1 and ΔV2 relative to baseline voltage at the same positions. Note the spike in the measured voltage at a position corresponding to the location of the deposition of the charge ΔQ. In essence, the example illustrated in FIG. 1 and FIG. 2 is a differential measurement. It is noted that just two readings may be used to determine properties (e.g., thickness) of both dielectric layers 104, 108. Specifically, if the amount of charge ΔQ is known, and since ΔQ is the same for both measurements then the measured voltages ΔV1 and ΔV2 may be approximately related to the known charge ΔQ as ΔQ=$C_{108}$ΔV, and ΔQ=$C_{104}$ΔV2, where $C_{108}$ is the capacitance of the second dielectric layer 108 and $C_{104}$ is the capacitance of the first dielectric layer 104.

In general $C_{104}$ may be approximated as $C_{104}=\kappa_{104}\in_o A_{104}/T_{104}$, where, $\kappa_{104}$ is the dielectric constant for the first dielectric layer 104, $\in_o$ is the permittivity of free space $A_{104}$ is the area of the first dielectric layer 104 (measured in a plane perpendicular to the drawing) and $T_{104}$ is the thickness of the first dielectric layer 104. Similarly, $C_{108}$ may be approximated as $C_{108}=\kappa_{108}\in_o A_c/T_{108}$, where, $\kappa_{108}$ is the dielectric constant for the second dielectric layer 108, $A_c$ is the area over which the charge is deposited and $T_{108}$ is the thickness of the second dielectric layer. The thicknesses $T_{104}$ and $T_{108}$ may be expressed as:

$$T_{104}=(\Delta Q/\Delta V2)\kappa_{104}\in_o A_{104}$$

$$T_{108}=(\Delta Q/\Delta V)\kappa_{108}\in_o A_c$$

Where the dielectric constants $\kappa_{104}$ and $\kappa_{108}$ are known, these values may be used. If they are not known, then a value for a known material, e.g., a known oxide may be used to obtain an equivalent thickness for that known material. For example, in semiconductor manufacturing it is common to use the value 3.9 if the dielectric constant is not known. The resulting thickness value is then referred to as an equivalent oxide thickness (EOT). It is noted that the thickness or EOT of the first dielectric layer 104 may be determined from ΔV2 alone.

In embodiments of the present invention the ΔV1 and ΔV2 measurements may be non-contact voltage measurements obtained using a work function sensor, such as a Kelvin probe, Monroe probes Electrostatic Force probe, or atomic force microscope (AFM) type of probe. The ΔV1 and ΔV2 voltage measurements may be made measurements of voltages that alternate at a frequency between about 0 and about 1 MHz.

The ΔV1 and ΔV2 voltage measurements may be made by the point or scan measurements or multi probe voltage measurements.

Experiments involving measurement of surface voltage Vs profiles on oxide/poly/56A oxide test pads show that EOT values obtained using the technique outlined above match very well with expected thickness values and are quite stable from pad to pad when multiple pads are formed from the same dielectric film stack. The $R^2$ correlation between electrical thickness and the expected thickness is about 1 and short term stability (in terms of variation from pad to pad) was determined to be less than 0.4%.

Using the technique described above with respect to FIG. 1 and FIG. 2, gate oxide thickness under a semiconductor or conductor layer may be determined by two voltage readings, one on the charge deposited area and one off the charge deposited area. An advantage of the implementation shown in FIG. 1 and FIG. 2 is that the measurements may be performed using measurements performed on a single test pad.

Figure 3A:
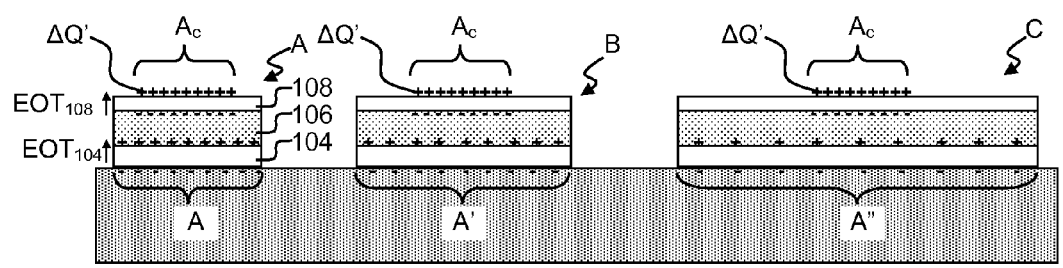
FIG. 3A is a cross-sectional schematic diagram of a portion of a semiconductor device substrate illustrating determination of an electrical property in a dielectric stack using varying sized test pads according to an alternative embodiment of the present invention.

Alternative embodiments of the invention may make use of multiple (e.g., two or more) test pads of the type shown in FIG. 1 to determine properties of the second dielectric layer 108. Such test pads may be formed in a scribe line as described above. Electrical charge may be deposited at one or more locations on each test pad. By way of example, there may be three different test pads A, B and C as shown in FIG. 3A. Each test pad may be formed on the substrate 102 from the dielectric film stack involving dielectric layers 104, 108 and intermediate layer 106. The test pads A, B, and C may have different areas $A_m$=A, A' and A" respectively. By way of example each test pad A, B and C may be in the shape of a square and may have dimensions of 50 μm, 100 μm and 200 μm respectively. Alternatively, the test pads may be in the shape of polygons, trenches, mazes or arrays of small dots. In addition, although three test pads are shown for the sake of example, embodiments of the invention are not limited by the number of pads used.

Charge may be deposited on each pad. Electrical measurements may then be taken on separate pads, and then used to extract properties such as thickness and leakage parameters of one or more of the dielectric layers 104, 108 on the dielectric film stack from which the test pads A, B and C are formed. Such properties may be obtained by determining a relationship between the measurements and areas of the test pads and extracting the property of the second dielectric layer from the relationship.

Figure 3B:
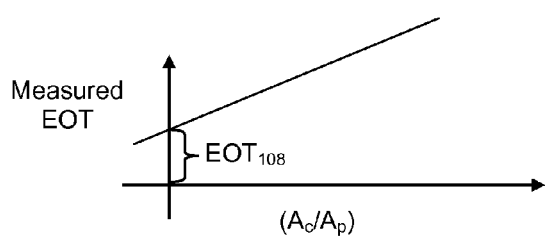
FIG. 3B is a graph illustrating determination of an electrical property from measurements made on the different sized test pads of FIG. 3A.

By way of example, a known amount of charge ΔQ' (which may be either positive or negative) may be deposited at one or more locations over a known area $A_c$ on each test pad A, B and C, e.g., as described above with respect to FIG. 1 and FIG. 2. A voltage ΔV1 may then be measured at the location of the charge on each test pad. A measured equivalent oxide thickness $EOT_m$ may then be determined for each pad from the values of ΔV1 as $EOT_m=(\Delta V1_m/\Delta Q')A_c$. It may be shown that the measured equivalent oxide thickness $EOT_m$ is related to the equivalent oxide thicknesses $EOT_{104}$ and $EOT_{108}$ for the first and second dielectric layers 104, 108 respectively by $EOT_m=EOT_{104}(A_c/A_m)+EOT_{108}$. Thus, by plotting $EOT_m$ versus $(A_c/A_m)$, e.g., as shown in FIG. 3B, one may determine $EOT_{108}$ from the intercept and $EOT_{104}$ from the slope of the resulting plot. Note that in this example, a single voltage measurement $\Delta V1_m$ was made at each test pad A, B and C. In this example, the same amount of charge ΔQ' is deposited at each test pad. Although not strictly necessary, this can simplify the computations used to determine the relationship between $EOT_m$ and $A_c/A_m$.

Embodiments of the present invention may be used to determine dielectric layer properties based on leakage property measurements. Such leakage property measurements may comprise leakage current density measurements, rate of change of voltage (dV/dt) measurements, dielectric film resistivity measurements, Tunnel, saturated Vs measurements by corona technique, Tunnel voltage (soft breakdown) measurements and hard breakdown voltage measurements. By way of example dV/dt measurements may involve measurement of a surface voltage of the first or second dielectric layer, a voltage of the first or second dielectric layer or a total voltage of the first or second dielectric layer plus a band bending voltage. By way of example, a sequence of measurements of ΔV1 taken at known times may be used to determine dV/dt.

Figure 4A:
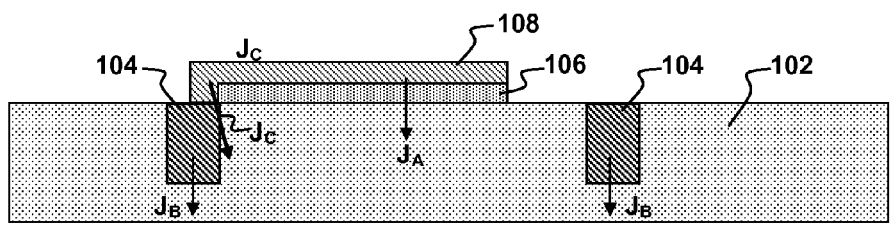
FIG. 4A is a cross-sectional schematic diagram of a partially fabricated field effect transistor illustrating corner leakage.

Specifically, embodiments of the present invention may be applied to measurement of corner leakage in three dimensional structures. By way of example, FIG. 4A illustrates corner leakage in the case of field effect transistor formed on the substrate 102 with the first dielectric layers 104, 108. By way of example doped regions of the substrate 102 act as a source and a drain. The first dielectric layer 104 may be configured as a silicon trench isolation (STI) region that surrounds the source S and drain D. The second dielectric layer 108 may be configured as a gate dielectric disposed on the substrate 102. If charge is deposited on the first dielectric layer 104, the charge may leak to the substrate 102 as a leakage current density $J_B$. Similarly, if charge is deposited on the second dielectric layer 108, the charge may leak to the substrate 102 as a leakage current density $J_A$. In addition, there may be a corner leakage current density $J_C$ corresponding to charge leaking from the coroner of the first dielectric layer 104 to the substrate 102.

Figure 4B:
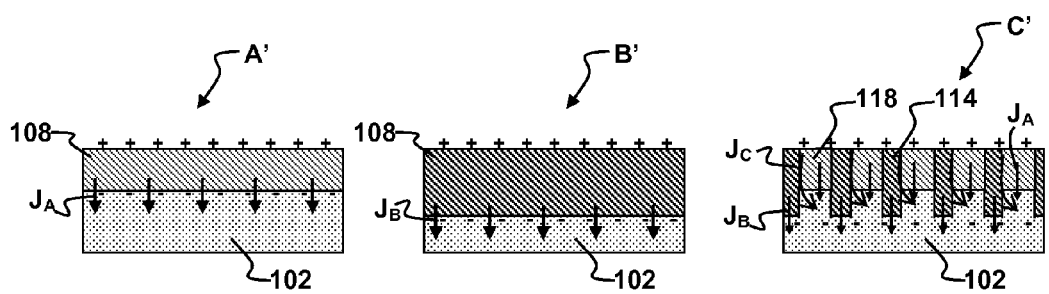
FIG. 4B is a cross-sectional schematic diagram of test pads on a portion of a semiconductor device substrate illustrating measurement of corner leakage detection according to an embodiment of the present invention.

Embodiments of the present invention may be used for to determine corner leakage current or leakage current density (current per unit area). By way of example, a plurality of test pads A', B', and C' may be formed on scribe line of the substrate 102 as shown in FIG. 4B. Test pad A' may have a portion of the second dielectric layer 108 formed on the substrate 102 to a thickness $t_1$. Test pad B' may have a portion of the first dielectric layer 104 formed on the substrate 102 to a thickness $t_2$. Test pad C' may have structures 118 formed from the material of the second dielectric layer 108 adjacent one or more structures 114 formed from the material of the first dielectric layer 104. The structures 118 may be formed to a thickness $t_3$ and the structures 114 may be formed to a thickness $t_4$. By way of example, $t_1=t_3$ and $t_2=t_4$.

Figure 4C:
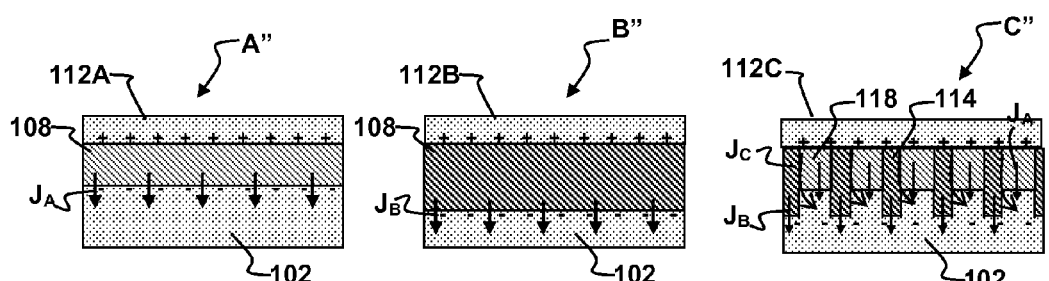
FIG. 4C is a cross-sectional schematic diagram showing an alternative configuration of test pads on a portion of a semiconductor device substrate for measurement of corner leakage detection according to an embodiment of the present invention.
Figure 4D:
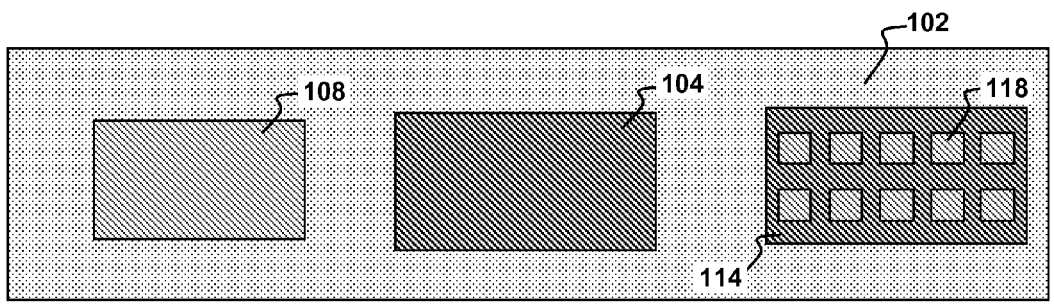
FIG. 4D is a top view schematic diagram of the test pads of FIGS. 4B and 4C.

In an alternative embodiment, depicted in FIG. 4C, test pads A", B" and C" may be similarly configured, but with conductive layers, such as metal or polysilicon layer, 112A, 112B and 112C over the test pads. The top view schematic diagram of FIG. 4D depicts a possible layout of the test pads shown in FIGS. 4B and 4C.

By way of example the test pads A', B' and C' may have the same pad size with different patterns, structures or combinations of the first and second dielectric layer materials. It is noted that embodiments of the invention are not limited by the size and number of test pads number and size. The test pad A', B' may have a similar test pad pattern as pad C' but with a different area ratio of the structures 114, 118. The area ratio of the structures 114, 118 may be computed, e.g., by dividing the area of the structures 114 by the area of the structures 118, where both areas a measured in a plane parallel to the surface of the substrate 102. Charge may be deposited on the pads A', B', C' (or A", B", C") and measurements made on these separate pads can be used to extract information regarding corner leakage and damage information by plasma etch, ash and any other related process in semiconductor device manufacture.

The corner leakage may be determined as follows. After depositing charge on test structure A' measurement related to leakage of the charge from test pad A' may be made. After depositing charge on test structure B', one or more measurements related to leakage of the charge from test pad B' may be made. After depositing charge on test structure C' measurement related to leakage of the charge from test pad A' may be made. It is noted that the leakage from test pad A' depends on $J_A$ and the leakage from test pad B' depends on $J_B$ and that the leakage from pad C' depends on $J_C$ as well as $J_A$ and $J_B$. Consequently, the corner leakage $J_C$ may be determined by subtracting the leakage measurements from test pads A' and B' from the measurement from test pad C'. If the test pad A' and B' has the similar test pattern as the test pad C', the corner leakage $J_C$ may be determined by total leakage current J as function of the area ratio of the structures 114, 118.

In embodiments of the present invention measurements may be performed using contact or non-contact electrical measurement techniques. Examples of non-contact measurement techniques include a capacitance-voltage (CV) measurement technique and charge-voltage (QV) measurement techniques. Briefly, for a traditional Q-V measurement sequence, a charge is first deposited on an area of the film. A measurement head is then moved over the charged area, and the surface voltage is measured. From the measured surface voltages at two different deposited charges, $Q_1$ and $Q_2$, EOT can be measured. One such method is illustrated in U.S. Patent Application Ser. No. 60/423,225 entitled "Methods for Non-Contacting Differential Voltage Measurements," filed Nov. 1, 2002, which is incorporated by reference as if fully set forth herein.

Figure 5:
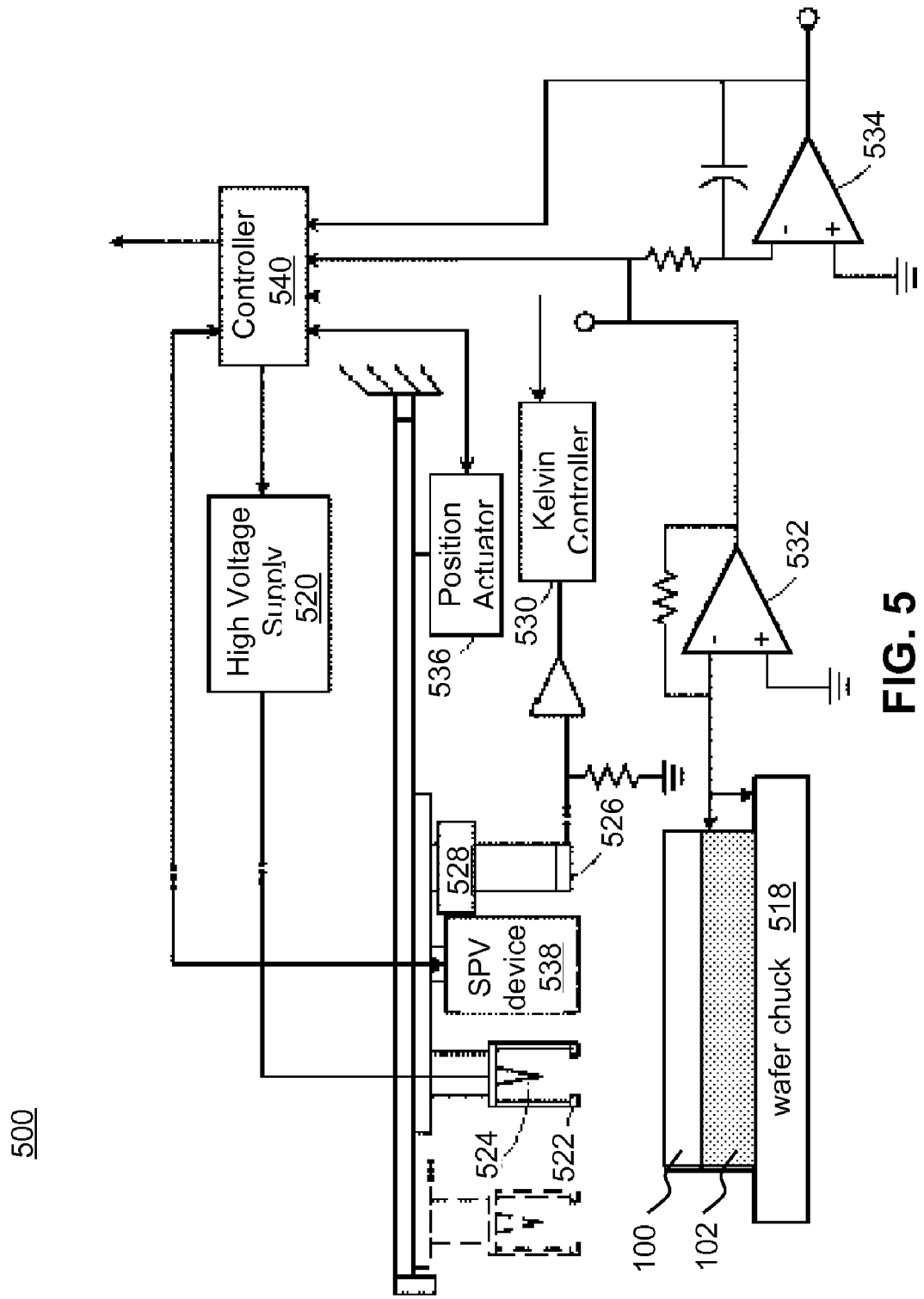
FIG. 5 is a schematic diagram of a system configured to measure charge density and voltage using non-contacting techniques in accordance with embodiments of the present invention.

Embodiments of the invention may use non-contact micro QV type technology and are also suitable for any contact micro CV measurement. By way of example, embodiments of the present invention may use a non contact, corona-based micro QV technique to measure the thickness or other properties of a dielectric layer on or under a semiconductor or conductor layer in a dielectric/conductor/dielectric sandwich film stack. An example of a system 500 configured to measure charge density and voltage using non-contacting techniques is illustrated in FIG. 5. The system 500 may be configured to measure current-voltage characteristics of insulating film that is part of the dielectric stack 100 formed on substrate 102. The system 500 may include wafer chuck 518 configured to hold substrate 102 during a measurement process. The wafer chuck 518 may also provide a grounding contact to the substrate 102. The grounding contact may be obtained, for example, from a high pressure contact using a sharp tungsten carbide needle. The system may also include a charge deposition device, such as a high voltage supply 520 coupled to a corona gun 522. The high voltage supply 520 may be configured to supply high voltage (e.g., about 6 kV to about 12 kV) to the corona gun to produce positive or negative corona charges depending on the polarity of supply 520. Corona gun 522 may include one or more needles 524 coupled to the high voltage supply 520.

In addition, the system may include a Kelvin probe 526. The Kelvin probe 526 may include an electrode coupled to a vibrating mechanism 528. Movement of the probe 526 above a charged surface may result in an AC voltage representative of the potential of the charged surface. A Kelvin controller 530 may be configured to convert an AC voltage to a signal corresponding to the voltage of the surface.

Current flowing through various parts of the dielectric stack 100 and substrate 102 from the corona gun 522 may be converted to a voltage by the current-to-voltage converter 532. This voltage (current) may be integrated by a charge integrator 534 to provide a measure of the charge deposited by corona gun 522 on insulating film dielectric stack 100. The circuits, thus, may be configured as a coulombmeter. The system 500 may also include position actuator 536. Position actuator 536 may be configured to move corona gun 522 and/or Kelvin probe 526 with respect to the substrate 102, as shown in phantom in FIG. 5. Such movement may be used in scanning measurements of the type described above with respect to FIG. 2. The system 500 may also include surface photo voltage (SPV) device 538. SPV device 538 may be configured to make an SPV measurement using a relatively high intensity light source such as a xenon flash tube.

The system 500 may further include a controller 540 configured to control operation of the various components of the system 500. For example, the controller 540 may be configured to control position actuator 536 and high voltage supply 520 in response to signals from the Kelvin controller 530, the current-to-voltage converter 532, and the current-to-charge integrator 534. The Kelvin controller 530 may also be configured to provide a measurement of the current-voltage behavior of various layers or test pads formed from the dielectric stack 100 and substrate 102. The controller 540 may be, for example, a dedicated microprocessor-based controller or a general purpose computer. The controller 540 may include logic that implements a method for determining dielectric thickness, dielectric leakage or other electrical information in a multilayer film stack, the multilayer film stack, e.g., as described above. Such logic may be implemented in hardware or in software, e.g., as processor-readable instructions. Such instructions may direct the actuator 536 to position the corona gun 522 over a desired region on the dielectric film stack 100; direct the high voltage supply 520 and corona gun 522 to deposit charge on the desired region; and direct the Kelvin controller 530 to take measurements with the Kelvin probe 526 at the localized region. The instructions may also include algorithms, subroutines or functions that determine a property of one or more of the dielectric layers in the dielectric film stack 100 from the Kelvin probe measurements, e.g., as described above. The instructions may be embodied in a processor-readable medium such as a computer memory, flash memory, CD-ROM, hard disk, floppy disk, and the like.

Figure 6:
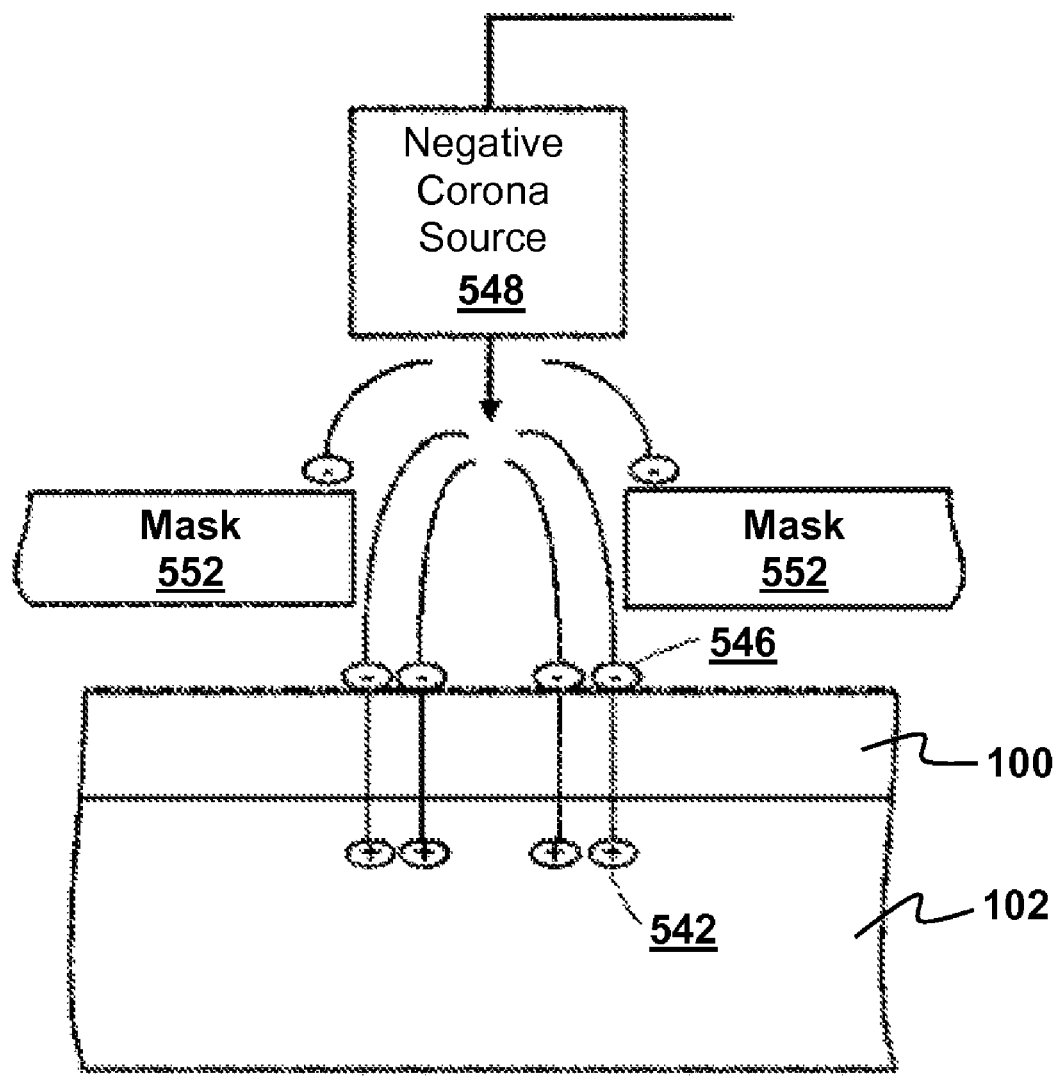
FIG. 6 is a schematic diagram illustrating charge deposition on a surface of an insulating film using a corona source in accordance with embodiments of the present invention.

As discussed above, charge may be deposited on the surface of dielectric layers or test pads by corona discharge. FIG. 6 illustrates an example of charge deposition on a surface of an insulating film using a corona source such as the corona gun 522. By way of example, and without loss of generality, positive charge accumulation 542 in p-type silicon substrate 102 may result from the deposition of negative charges 546 from a negative corona source 548 onto an exposed surface of dielectric layer of the dielectric film stack 100 overlying substrate 102. The corona discharge may be applied to the area of interest via a mask 552. In some embodiments, it may be necessary for purposes of obtaining accurate thickness measurements, that a substantially uniform density of charge 546 be deposited through the aperture in mask 552.

Figure 7:
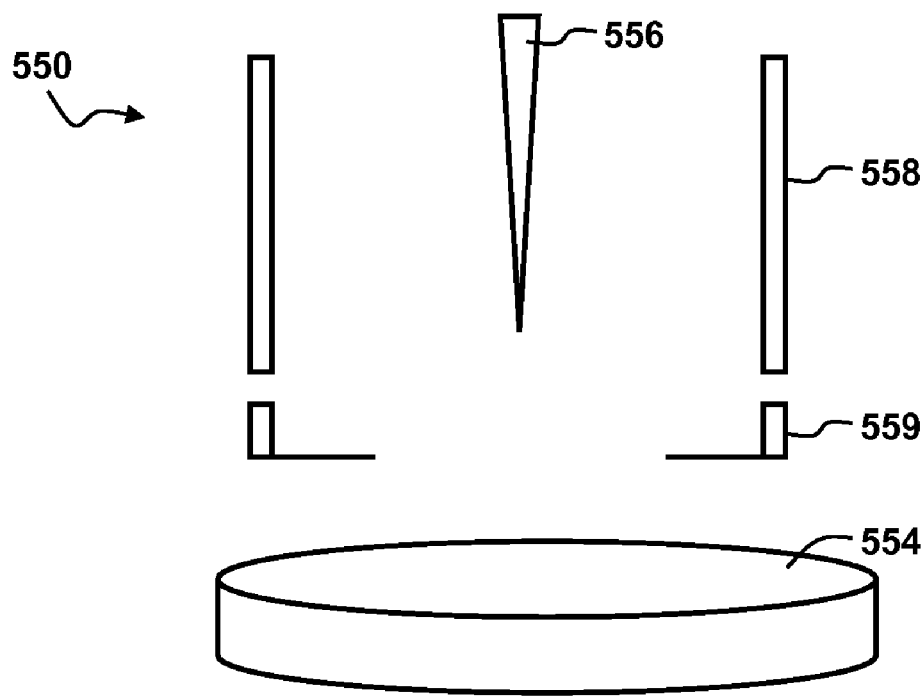
FIGS. 7 and 8 are schematic diagrams illustrating partial cross-sectional views of alternative corona sources that may be used in conjunction with embodiments of the present invention.
Figure 8:
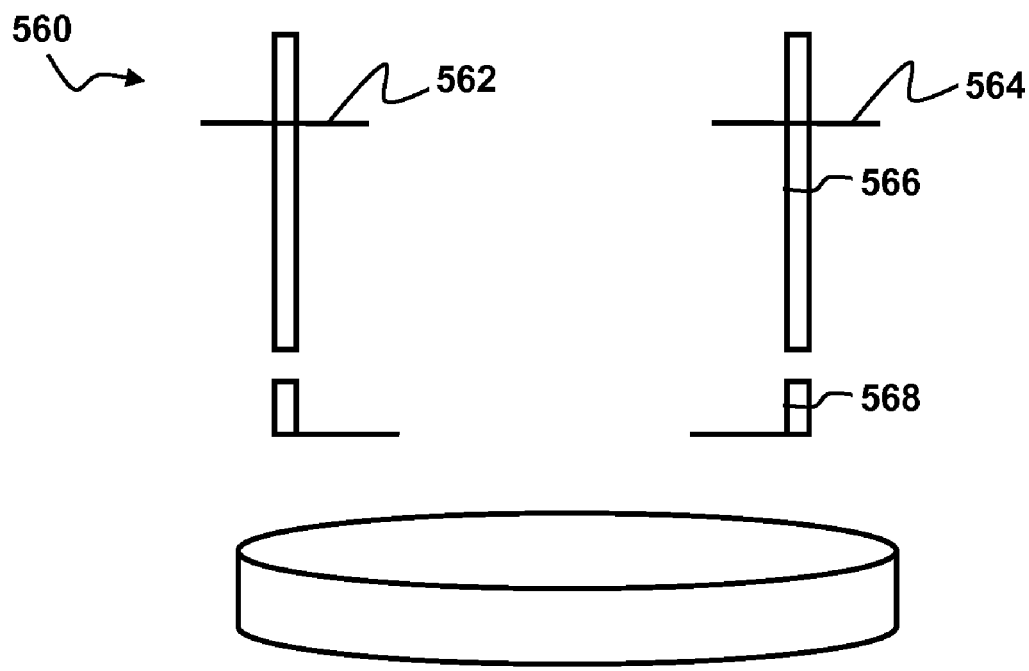

FIGS. 7 and 8 illustrate partial cross-sectional views of alternative corona sources 550 and 560, which may be used to deposit a charge substantially uniformly over a localized region of a specimen 554. The specimen 554 may include an insulating film and a substrate as described herein. The corona sources may be configured to provide a well-defined and substantial beam charge density (to minimize measurement time) having relative uniformity (for measurement accuracy) across the selected site of interest on specimen 554. As shown in FIG. 7, a corona 550 source may include a needle 556 and beam shaping electrodes 558 and 559. The beam shaping electrodes 558 and 559 may be concentric with an axis of needle 556.

The beam shaping electrodes 558 and 559 and the biasing voltages applied thereto may improve the corona charging capability of the gun in two important ways. First, a lower electrode 559 may act as a mask for defining the diameter of the area of corona deposition. Second, the bias voltage on the lower electrode 559 (with the same polarity as the corona ions) repels ions that normally would be captured by the edge of electrode 559 and directs them down to the specimen site with an enhanced density that abruptly ceases under the edge of electrode 559.

An upper electrode 558 may help to boost the efficiency of the corona source by being biased at a relatively high voltage (e.g., up to about ±3 kV) with the same polarity as the corona ions. Potentials in the range of ±6 to 9 kV and up to about ±1.5 kV are appropriate for needle 556 and lower electrode 559, respectively. This may result in an electric field configuration in the upper region of the corona source that prevents many of the ions from being captured by the upper electrode and directs them down to lower electrode 559 which, in turn, directs them to site on the specimen 554. It should be noted that the needle 556 and electrodes 559 and 559 may be supported and insulated from each other by suitable insulated support members (not shown) that may allow for the application of the necessary biases.

The corona source 560 depicted in FIG. 8 is essentially the same as the source 550 of FIG. 7 except for the important difference that two facing and horizontal needles 562 and 564 are provided in lieu of the single vertical needle 556 of FIG. 7. The potential applied to needles 562 and 564 and electrodes 566 and 568 of FIG. 8 may be the same as the corresponding parts described above with respect to FIG. 7.

Additional examples of non-contact corona sources are illustrated in U.S. Pat. No. 4,599,558 to Castellano et al., U.S. Pat. No. 5,594,247 to Verkuil et al., and U.S. Pat. No. 5,644, 223 to Verkuil and are incorporated by reference as if fully set forth herein. In an embodiment, a system as described herein, may include a non-contact work function sensor such as a Monroe probe in place of a Kelvin probe. Further examples of work function sensors that may be incorporated into the system are illustrated in U.S. Pat. No. 4,812,756 to Curtis et al., U.S. Pat. No. 5,650,731 to Fung, and U.S. Pat. No. 5,767,693 to Verkuil, which are incorporated by reference as if fully set forth herein. In addition, any other appropriate system and corona source known in the art may be used for carrying out a method as described herein. Furthermore, a system configured to perform the methods described herein may be coupled to a process tool. Examples of a process tool that the measurement system may be coupled to include, for example, a deposition tool, a thermal growth tool, an ion implantation tool, an anneal tool, and a decoupled plasma nitridation (DPN) tool.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for determining dielectric thickness, dielectric leakage or other electrical information in a multilayer film stack on a semiconducting or conducting substrate, the multilayer film stack comprising one or more test pads, each of which comprises a first dielectric layer between the substrate and an intermediate layer of semiconducting or conducting material, and a second dielectric layer disposed such that the intermediate layer is between the first and second dielectric layers, the method comprising:
   a) depositing electrical charge at one or more localized regions on an exposed surface of the second dielectric layer of each test pad;
   b) performing one or more measurements of an electrical quantity at the one or more localized regions;
   c) determining a relationship between the measured electrical quantity and an area of the test pads; and
   d) extracting a property of the second dielectric layer from the relationship.

2. The method of claim 1, wherein one or more measurements are voltage measurements.

3. The method of claim 2 wherein the property of the second dielectric layer is a thickness of the second dielectric layer.

4. The method of claim 3 wherein the thickness is an equivalent oxide thickness (EOT).

5. The method of claim 2 wherein the one or more measurements are non-contact voltage measurements obtained using a work function sensor.

6. The method of claim 5 wherein the work function sensor is a Kelvin probe, Monroe probes Electrostatic Force probe, or atomic force microscope (AFM) type of probe.

7. The method of claim 1 wherein the one or more measurements comprise measuring a voltage that alternates at a frequency between about 0 and about 1 MHz.

8. The method of claim 1 wherein the one or more measurements are measurements of a total charge, surface photo-induced voltage (SPV), charge versus time, leakage current, interface trapped density ($D_{it}$), flat band voltage ($V_{fb}$).

9. The method of claim 1 wherein the property of the second dielectric layer is a value of the electrical quantity for the second dielectric layer.

10. The method of claim 1 wherein a) comprises depositing electrical charge at a first location on an exposed surface of the second dielectric layer but not at a second location on the exposed surface;
   wherein b) comprises performing a first measurement of an electrical quantity between the substrate and the exposed surface at the first location and performing a second measurement of the electrical quantity at the second location; and
   wherein c) comprises determining a property of the second dielectric layer from the first and second measurements.

11. The method of claim 10, further comprising determining a property of the first dielectric layer using only the second measurement.

12. The method of claim 10, wherein the first and second measurements are leakage property measurements.

13. The method of claim 12 wherein the leakage property measurements comprise leakage current density measurements, rate of change of voltage (dV/dt) measurements, dielectric film resistivity measurements, saturated Vs measurements by corona technique, Tunnel voltage (soft breakdown) measurements or hard breakdown voltage measurements.

14. The method of claim 13 wherein the leakage property measurements comprise rate of change of voltage (dV/dt) wherein the voltage is a surface voltage of the first or second dielectric layer, a voltage of the first or second dielectric layer or a total voltage of the first or second dielectric layer plus a band bending voltage.

15. The method of claim 10 wherein the first and second measurements are performed using a contact or non-contact electrical measurement techniques.

16. The method of claim 15 wherein the first and second measurements are performed using a non-contact measurement technique.

17. The method of claim 16 wherein the non-contact measurement technique comprises a capacitance-voltage (CV) measurement technique.

18. The method of claim 1 wherein depositing electrical charge comprises the use of corona discharge, electron beam, ion beam, defined area source or wire source.

19. The method of claim 1 wherein the or more test pads are formed in a scribe line between two or more adjacent integrated circuit device die on the substrate.

20. The method of claim 19 wherein the one or more test pads comprise two or more test pads.

21. The method of claim 20 wherein the one or more test pads are in the shape of a polygon, trench, maze or array of small dots.

22. The method of claim 20 wherein the test pads have different areas.

23. The method of claim 1 wherein a) comprises depositing electrical charge at a single localized region.

24. The method of claim 1 wherein the first dielectric layer comprises $SiO_2$, SiN, SiC, a metal oxide (high k) film or a low k film.

25. The method of claim 24 wherein the first dielectric layer comprises a low k film from the group of carbon doped oxide, porous ultra low k film and spin-on polymer low k film, SiLk, Nanoglass and MSQ low k film.

26. The method of claim 1, wherein the substrate is a silicon, GaAs, Ge or mixture of semiconductor substrate.

27. The method of claim 1 wherein the silicon substrate is a P type or N type silicon substrate.

28. A method for determining dielectric thickness, dielectric leakage or other electrical information in a multilayer film stack on a semiconducting or conducting substrate, the multilayer film stack comprising a first dielectric layer between the substrate and an intermediate layer of semiconducting or conducting material, and a second dielectric layer disposed such that the intermediate layer is between the first and second dielectric layers, the method comprising:
   a) depositing electrical charge at one or more localized regions on an exposed surface of the second dielectric layer, wherein a) comprises:
   depositing charge on a first test structure located on the substrate, wherein the first test structure comprises a material of the first dielectric layer;
   depositing charge on a second test structure located on the substrate, wherein the second test structure comprises a material of the first dielectric layer;
   depositing charge on a third test structure located on the substrate, wherein the third test structure comprises one or more regions of the material of the first dielectric layer and one or more regions of the material of the second dielectric layer; and wherein b) comprises measuring leakage currents from the first, second and third test structures to the substrate; and
   determining a corner leakage from the leakage currents from first, second and third test structures;
   b) performing one or more measurements of an electrical quantity at the one or more localized regions; and
   c) determining a property of the second dielectric layer from the one or more measurements.

29. The method of claim 28, further comprising forming the first, second and third test structures on the substrate.

30. The method of claim 29 wherein a surface area of the first test structure is equal to a surface area of the one or more regions of the first dielectric material in the third test structure and wherein a surface area of the second test structure is equal to a surface area of the one or more regions of the second dielectric material in the third test structure.

31. The method of claim 28 wherein the first test structure comprises a layer of the second dielectric material having a second thickness $t_1$ and wherein the second test structure comprises a layer of the second dielectric material having a second thickness $t_2$, wherein the third test structure comprises one or more regions of the first dielectric material of thickness $t_3$ and one or more regions of the second dielectric material of thickness $t_4$.

32. The method of claim 31 wherein $t_1=t_3$ and $t_2=t_4$.

33. The method of claim 28 wherein determining a corner leakage from the leakage currents from first, second and third test structure includes taking a difference between the leakage current from the third test structure and the leakage currents from the first and second test structure.

34. An apparatus for determining a dielectric thickness, dielectric leakage or other electrical information in a multilayer film stack on a semiconducting or conducting substrate, the multilayer film stack comprising one or more test pads, each of which comprises a first dielectric layer between the substrate and an intermediate layer of semiconducting or conducting material, and a second dielectric layer disposed such that the intermediate layer is between the first and second dielectric layers, the system comprising:
   a) a charge deposition device configured to deposit electrical charge at one or more localized regions on an exposed surface of the second dielectric layer of each test pad;
   b) an electrical measurement device configured to perform one or more measurements of an electrical quantity at the one or more localized regions;
   c) a controller coupled to the electrical measurement device configured to determine a relationship between the measured electrical quantity and an area of the test pads and to extract a property of the second dielectric layer from the relationship.

35. A non-transitory processor-readable medium having embodied therein processor-readable instructions for implementing a method for determining a dielectric thickness, dielectric leakage or other electrical information in a multilayer film stack on a conducting or semiconducting substrate, the multilayer film stack comprising one or more test pads, each of which comprises a first dielectric layer between the substrate and an intermediate layer of semiconducting or conducting material, and a second dielectric layer disposed such that the intermediate layer is between the first and second dielectric layers, the instructions be operable with an apparatus having a charge deposition device configured to deposit electrical charge at one or more localized regions on an exposed surface of the second dielectric layer of each test pad, an electrical measurement device configured to perform measurement of an electrical quantity at the one or more localized regions and a controller coupled to the electrical measurement device, the instructions comprising:
   a) an instruction that, when executed by the controller, causes the charge deposition device to deposit electrical charge at the one or more localized regions on an exposed surface of the second dielectric layer of each test pad;

b) an instruction that, when executed by the controller, causes the measurement device to perform one or more measurements of an electrical quantity at the one or more localized regions;

c) an instruction that, when executed by the controller, determines a relationship between the measured electrical quantity and an area of the test pads and extracts a property of the second dielectric layer from the relationship.

* * * * *